(12) United States Patent
Silvano de Sousa et al.

(10) Patent No.: US 10,736,222 B2
(45) Date of Patent: Aug. 4, 2020

(54) COOLING COMPONENT CARRIER MATERIAL BY CARBON STRUCTURE WITHIN DIELECTRIC SHELL

(71) Applicant: AT&S Austria Technologie & Systemtechnik Aktiengesellschaft, Leoben (AT)

(72) Inventors: Jonathan Silvano de Sousa, Vienna (AT); Markus Leitgeb, Trofaiach (AT); Walter Pessl, Leoben (AT)

(73) Assignee: AT&S Austria Technologies & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/313,924

(22) PCT Filed: Jun. 29, 2017

(86) PCT No.: PCT/EP2017/066145
§ 371 (c)(1),
(2) Date: Dec. 28, 2018

(87) PCT Pub. No.: WO2018/002230
PCT Pub. Date: Jan. 4, 2018

(65) Prior Publication Data
US 2019/0174638 A1 Jun. 6, 2019

(30) Foreign Application Priority Data
Jun. 29, 2016 (DE) .................. 10 2016 111 936

(51) Int. Cl.
*H05K 1/02* (2006.01)
*H05K 3/00* (2006.01)
(Continued)

(52) U.S. Cl.
CPC ......... *H05K 3/4608* (2013.01); *H05K 1/0206* (2013.01); *H05K 1/0207* (2013.01);
(Continued)

(58) Field of Classification Search
CPC .. H05K 1/0201; H05K 1/0203; H05K 1/0204; H05K 1/0206; H05K 1/0207;
(Continued)

(56) References Cited

U.S. PATENT DOCUMENTS 6,514,616 B1 2/2003 Gandi et al.
2006/0104035 A1* 5/2006 Vasoya .................. H01L 23/36
361/704

(Continued)

FOREIGN PATENT DOCUMENTS

DE 691 13 108 T2 5/1996
DE 10 2009 035 850 A1 2/2011
(Continued)

*Primary Examiner* — Jeremy C Norris
(74) *Attorney, Agent, or Firm* — Robert A. Blaha; Smith Tempel Blaha LLC

(57) ABSTRACT

A component carrier includes component carrier material and a heat spreading module with a carbon structure enclosed within a dielectric shell for disabling contact between the carbon structure and the component carrier material.

23 Claims, 9 Drawing Sheets

(51) Int. Cl.
*H05K 3/46* (2006.01)
*H05K 1/18* (2006.01)

(52) U.S. Cl.
CPC ......... *H05K 1/0209* (2013.01); *H05K 3/0061* (2013.01); *H05K 1/181* (2013.01); *H05K 1/185* (2013.01); *H05K 2201/0141* (2013.01); *H05K 2201/0154* (2013.01); *H05K 2201/0323* (2013.01); *H05K 2201/066* (2013.01); *H05K 2201/068* (2013.01); *H05K 2201/096* (2013.01); *H05K 2201/09554* (2013.01); *H05K 2201/1006* (2013.01); *H05K 2201/10037* (2013.01); *H05K 2201/10053* (2013.01); *H05K 2201/10083* (2013.01); *H05K 2201/10121* (2013.01)

(58) Field of Classification Search
CPC .... H05K 1/0209; H05K 1/021; H05K 3/0061; H05K 3/4608
See application file for complete search history.

(56) References Cited

U.S. PATENT DOCUMENTS

| | | |
|---|---|---|
| 2016/0029488 A1 | 1/2016 | Kang et al. |
| 2016/0143129 A1 | 5/2016 | Min et al. |
| 2016/0309575 A1 | 10/2016 | Min et al. |
| 2017/0094773 A1* | 3/2017 | Seo ..................... H05K 1/0206 |

FOREIGN PATENT DOCUMENTS

| | | |
|---|---|---|
| EP | 1 111 971 A1 | 6/2001 |
| EP | 1 167 293 A1 | 1/2002 |
| EP | 1 821 586 B1 | 10/2009 |
| WO | WO 2004097934 A2 | 11/2004 |
| WO | WO 2012033896 A1 | 3/2012 |
| WO | WO 2015199394 A1 | 12/2015 |

* cited by examiner

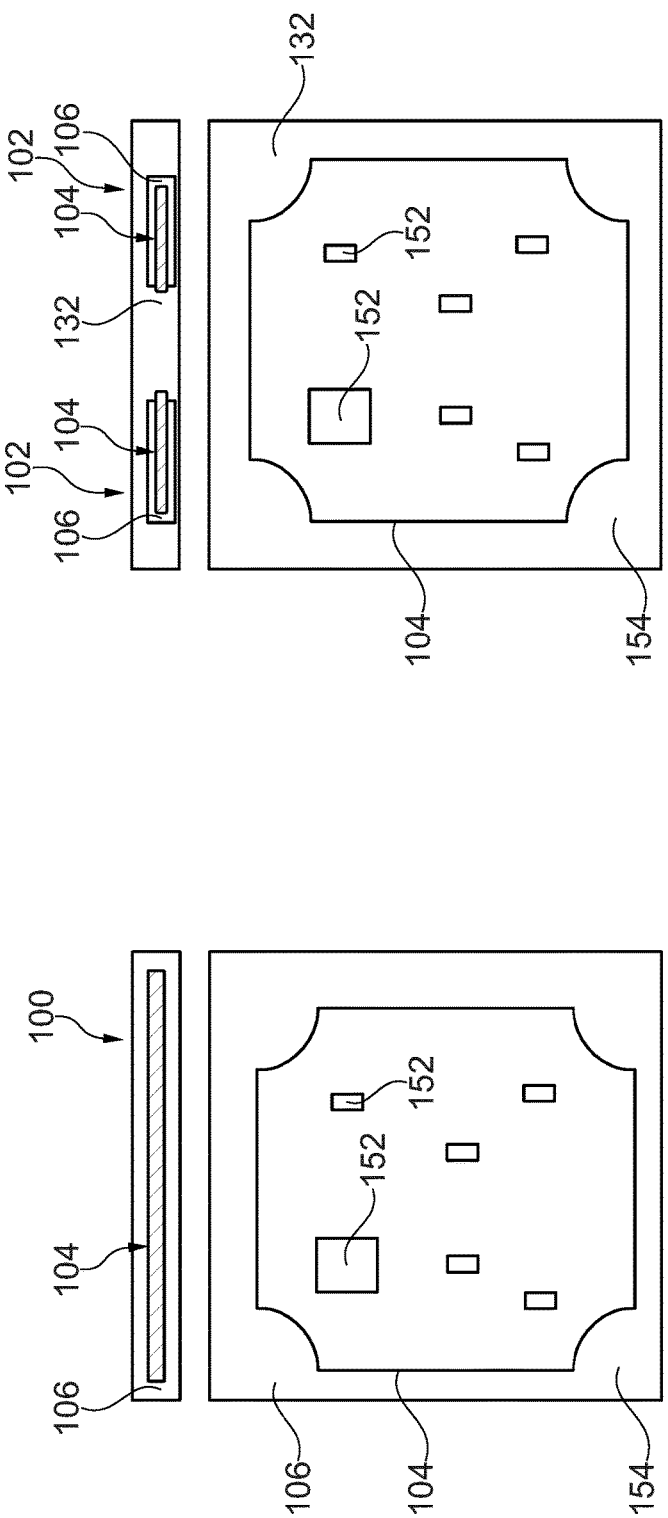
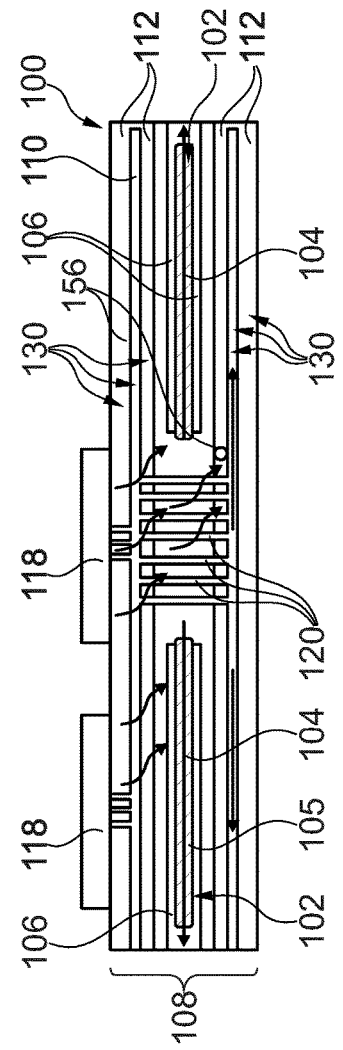
Fig. 4
Fig. 5
Fig. 6

COOLING COMPONENT CARRIER MATERIAL BY CARBON STRUCTURE WITHIN DIELECTRIC SHELL

TECHNICAL FIELD

The invention relates to component carriers, a method of manufacturing a component carrier, and methods of use.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

SUMMARY

There may be a need to provide an architecture for component carriers which allows to provide a proper heat dissipation while ensuring high mechanical integrity and electric reliability.

Component carriers, a method of manufacturing a component carrier, and methods of use according to the independent claims are provided.

According to an exemplary embodiment of the invention, a component carrier is provided which comprises component carrier material (such as PCB material) and a heat spreading module (which may for example be a cooling module) which comprises a carbon structure (preferably a graphite structure) enclosed within a dielectric shell for disabling or preventing any direct contact between the carbon structure and the component carrier material.

According to another exemplary embodiment of the invention, a component carrier is provided which comprises or consists of a carbon structure (preferably a graphite structure), a dielectric shell hermetically enclosing the carbon structure (in particular graphite structure), and a patterned electric conductor structure on and/or above the dielectric shell.

According to still another exemplary embodiment of the invention, a method of manufacturing a component carrier is provided, wherein the method comprises providing a heat spreading module which comprises a carbon structure (in particular a graphite structure) enclosed by a dielectric shell, and integrating (for instance embedding or surface mounting) the heat spreading module in (in particular within and/or on) component carrier material.

According to yet another exemplary embodiment of the invention, a heat spreading module comprising a graphite structure enclosed by a dielectric shell is used for removing heat of an electronic component of a printed circuit board (PCB).

According to yet another exemplary embodiment of the invention, a component carrier having the above-mentioned features is used as an inlay to be embedded in a larger component carrier.

Overview of Embodiments

In the context of the present application, the term "component carrier" may particularly denote any support structure which is capable of accommodating one or more electronic components thereon and/or therein for providing both mechanical support and electrical connectivity. In particular, a component carrier may be a printed circuit board or an IC (integrated circuit) substrate or interposer.

In the context of the present application, the term "heat spreading module" may particularly denote a modular structure or inlay which can be implemented as a whole in component carrier material (in particular electrically insulating component carrier material such as prepreg, resin, and/or electrically conductive component carrier material such as copper) so as to serve for locally removing heat generated during operation of the component carrier. Hence, an interior of the heat spreading module may be specifically configured for an efficient cooling, whereas an exterior of the heat spreading module may be specifically configured for being compatible with the electrically insulating and/or electrically conductive component carrier material in terms of adhesion, matching thermal expansion properties, etc.

In the context of the present application, the term "dielectric shell" may particularly denote a (particularly soft or rigid) outer covering of the graphite structure disabling any direct interaction between the graphite structure and the surrounding component carrier material by fully circumferential encasing the graphite structure.

In the context of the present application, the term "carbon structure" may particularly denote a (particularly substantially pure) carbon material serving as heat removing core of the heat spreading module. In particular, such a carbon structure may comprise or consist of graphite, diamond like carbon, graphene, etc. All these materials have in common that they have a very high thermal conductivity but also have poor adhesion properties on many materials. In particular, the carbon structure may consist of carbon, more particularly may be substantially free of other materials.

According to an exemplary embodiment of the invention, a carbon structure is encased in a continuously closed shell of dielectric material to thereby provide a heat spreading module for implementation in a component carrier. The provision of a carbon core (in particular shaped as sheet) ensures a very high thermal conductivity and hence high cooling performance of the heat spreading module. The provision of the dielectric shell on the one hand reliably electrically decouples the (in many cases highly electrically conductive) carbon core from the adjacent component carrier material (in particular copper material) to prevent undesired short-circuiting or other parasitic electric effects caused by the carbon structure. Synergistically, the dielectric shell encasing the carbon structure mechanically decouples the—in combination with many materials very poorly adhesive—carbon structure from the surrounding component carrier material (in particular from dielectric resin material). Thus, undesired delamination of constituents of the component carrier may be efficiently suppressed by the dielectric shell which disables the carbon structure from coming into direct contact with the surrounding component carrier material and which may be selected so as to have, itself, proper adhesion properties with regard to the component carrier material. Therefore, a high thermal performance can be combined with a high mechanical integrity and a proper electrical reliability of a component carrier.

Thus, exemplary embodiments of the invention implement one or more dielectrically encased carbon islands with freely adjustable shape to be arranged locally at one or more heat critical sections of a component carrier. This allows it to benefit from the high thermal conductivity of the carbon material while the high electric conductivity of the carbon material may be advantageously deactivated by the dielectric shell. At the same time, the dielectric shell being interposed between the carbon material and the surrounding component carrier material prevents a direct contact between the carbon material and the component carrier material so that undesired delamination in particular under high temperature conditions (of for instance 260° to 300° C., in particular occurring during soldering) which may result in thermal mismatch may be prevented.

In the following, further exemplary embodiments of the component carriers and the methods will be explained.

In an embodiment, the carbon structure is a graphite structure. Graphite is preferred due to its highly advantageous thermally conductive properties. Graphite, as such, has however the undesired property of delaminating very easily. According to an exemplary embodiment, a sufficient mechanical stabilization can be achieved with the lamination or encapsulation of the graphite, preferably in combination with the use of low modulus material.

In an embodiment, the graphite structure is a graphite sheet. Configuring the graphite structure as a sheet, i.e. as a planar substantially two-dimensional flat structure, that has turned out as particularly advantageous in terms of heat removal. Furthermore, such a sheet like geometry is particularly properly compatible with component carrier requirements.

In an embodiment, the graphite structure comprises or consists of pyrolytic graphite. Pyrolytic graphite is a highly ordered type of graphite serving as highly efficient heat spreading material with high thermal conductivity. This material is lightweight and highly bendable. It can be cut into custom shapes, making it particularly useful for component carrier applications with limited space. In addition, it has excellent thermal conductivity properties, 600 W/(mK) to 1600 W/(mK), which allows to implement it for heat removal tasks in component carriers. In particular, it is believed that the thermal conductivity of the material increases for thinner layers due to the fact that the material is amorphous. Graphite with a thickness of 25 µm may have a thermal conductivity of 1600 W/mK.

In an embodiment, the component carrier comprises a stack of at least one electrically conductive layer structure and/or at least one electrically insulating layer structure, wherein the heat spreading module is mounted on and/or is embedded in the stack. Such a stack may be interconnected together with the one or more heat spreading modules by laminating, in particular by the application of thermal energy and/or pressure.

In an embodiment, the dielectric shell hermetically seals the graphite structure. Thus, the exterior of the heat spreading module may be completely decoupled from the graphite structure in an interior thereof. Any highly electrically conductive graphite particles (such as carbon dust), which might disturb the electric performance of the component carrier, can therefore be reliably preventing from leaving the heat spreading module.

In an embodiment, the entire dielectric shell is homogeneously made of the same material. By preventing the dielectric shell from being composed of different sections of different materials, it can be reliably prevented that carbon material gets into contact with a surrounding at material interfaces. By encasing the entire carbon structure by the same dielectric shell material, such weak points in terms of mechanical and electrical integrity can be prevented.

Alternatively, the dielectric shell may be composed of different materials, for instance in the event of exposing one or more graphite edges by patterning a heat spreading module for shape adjustment. In such a scenario, exposed carbon edges may be passivated by the subsequent provision of additional dielectric material.

In an embodiment, the component board with heat spreading module(s) may be a rigid board, a flex board, or a rigid flex board.

In an embodiment, the dielectric shell comprises at least one of the group consisting of a flexible material, a thermoplastic material, polyimide or a liquid crystal polymer. A liquid crystal polymer material and a polyimide material both have the advantage of being provided both in flexible or bendable form. This renders the mentioned materials particularly suitable for combination with a flexible or bendable carbon sheet for manufacturing a bendable flex board. In particular when both the dielectric shell as well as the carbon structure are mechanically flexible or bendable, a simple and compact flex board may be provided. A liquid crystal dielectric shell has turned out to be a highly efficient interface between carbon structure and component carrier material what concerns adhesion, electric insulation and heat transfer.

In an embodiment, the component carrier further comprises an adhesion promoter promoting adhesion and arranged (in particular directly) between the graphite structure and the dielectric shell. As mentioned above, highly thermally conductive carbon structures in many cases show a very poor adhesion with adjacent material, which involves the risk of delamination. Although a hermetic enclosure of the carbon structure with proper adhesion capability may already efficiently reduce the tendency of delamination and warpage of the component carrier, an additional adhesion promoter between carbon structure and dielectric shell may additionally improve intrinsic adhesion within the heat spreading module, thereby further strengthening mechanical integrity of the heat spreading module and the component carrier.

In an embodiment, the heat spreading module comprises at least one electric conductor structure (for instance made of copper) on the dielectric shell. For instance, one or more metal foils may be connected to the dielectric shell.

In an embodiment, the component carrier further comprises an electronic component mounted on and/or embedded in the stack. In the context of the present application, the term "electronic component" may particularly denote any bulky rather than layer-type active (such as a semiconductor chip) or passive (for instance a capacitor, a resistor or copper block) component embedded within an interior of the component carrier. Such an electronic component (for instance a chip) may be the source of a remarkable amount of heat generated during operation of the component carrier with embedded electronic component. When embedding, together with the electronic component, one or more heat spreading modules with the above features, efficient heat removal from such an embedded electronic component can be ensured. Hence, the electronic component may be located next to the heat spreading module so that heat generated during operation of the electronic component is at least partially removed by the heat spreading module.

In an embodiment, the at least one electrically insulating layer structure is made of a low shrinkage material. This means that the material of the at least one electrically insulating layer structure is selected so that no substantial shrinkage occurs upon compressing this material (in particular during lamination) and/or upon cooling this material.

In an embodiment, the at least one electrically insulating layer structure is made of a material having a low thermal expansion coefficient. When providing the at least one electrically insulating layer structure from a low CTE (coefficient of thermal expansion) material (in particular less than 10 ppm/K), in particular in a plane perpendicular to a stacking direction of the component carrier, the component carrier can be protected against thermal mismatch and thermal stress, in particular during a reflow process. In particular, the material of the electrically insulating layer structure may advantageously have a value of the thermal expansion coefficient in a range between 1 ppm/K and 10 ppm/K. However, it is alternatively possible that the value of the thermal expansion coefficient is in a range between 0 ppm/K and 1 ppm/K, or even assumes a negative value (for example for aramide based material).

In an embodiment, the at least one electrically insulating layer structure is made of a material having a low value of the Young modulus. Thus, the at least one electrically insulating layer structure may be made of a sufficiently soft material. This also prevents the component carrier from excessive mechanical stress and consequently reduces the risk of delamination, in particular during a reflow process. Preferably, the material of the at least one electrically insulating layer structure may have a value of the Young modulus of less than 15 GPa at 250° C., in particular of less than 10 GPa at 250° C. In a particularly preferred embodiment, the Young modulus is less than 8 GPa at 250° C., for instance around 5 GPa at 250° C.

In an embodiment, the component carrier comprises at least two heat spreading modules embedded in the stack with a respective heat removal access at a lateral edge of the stack, wherein at least one electrically conductive vertical interconnect structure electrically connects a portion above with a portion below the heat spreading modules. Thus, two-sided lateral heat removal can be combined with a highly efficient and compact vertical electric connection.

In an embodiment, the carbon structure (preferably graphite structure) comprises at least one of the group consisting of a planar layer, and a continuous structure with at least one horizontal layer section and a vertical section. When embodied as a planar layer, the geometry of the carbon structure perfectly fits to the layer-type constituents of component carriers such as printed circuit boards. Bendability of a carbon sheet also renders it possible to design three-dimensionally curved carbon structures for instance having two sheet-like parallel portions with a slanted or perpendicular connection portion in between.

In an embodiment, the component carrier further comprises a heat sink thermally coupled with the heat spreading module. For instance, such a heat sink may be a highly thermally conductive body (for instance made of copper or aluminum) for removing heat from the stack of component carrier material with integrated heat spreading module. A heat sink may have a plurality of cooling fins for improving heat exchange with an environment.

In an embodiment, the component carrier is flexible and/or bendable. This allows to combine proper thermal management as well as mechanical and electrical integrity with the flexibility of a circuit designer to freely bend the component carrier into substantially any desired shape. This opportunity is supported by the carbon structure (in particular graphite sheet) being provided also in bendable form. One application of such a flex board formed on the basis of a carbon structure is the provision of a camera module implemented in a three dimensionally curved casing and having a high heat removal capability.

In an embodiment, the method comprises patterning the carbon structure (in particular graphite structure) being coated with dielectric material to thereby expose a portion of the carbon structure, and subsequently covering the exposed portion of the carbon structure with additional dielectric material to thereby complete the dielectric shell of the carbon structure. By this procedure, it can be ensured on the one hand that a patterned carbon structure and consequently heat spreading module of substantially any desired shape may be manufactured. On the one hand, coating the carbon structure during patterning may at least prevent excessive contamination of the component carrier environment with highly electrically conductive material of the exposed carbon structure. On the other hand, exposure of portions of the carbon structure during patterning can be followed by the supply of additional dielectric material closing open portions of the dielectric shell to thereby hermetically enclose the previously partially uncovered carbon structure with dielectric material at the end of the patterning procedure.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further electronic components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design of the electronic device, wherein the component carrier nevertheless provides a large basis for mounting electronic components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and an IC substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "IC substrate" may particularly denote a small component carrier having substantially the same size as an electronic component to be mounted thereon.

In an embodiment, the at least one electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other electronic components may be embedded in the component carrier. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element.

In an embodiment, the at least one electrically insulating layer structure comprises at least one of the group consisting of resin (such as reinforced or non-reinforced resins, for instance epoxy resin or Bismaleimide-Triazine resin or cyanate ester), glass (in particular glass fibers, multi-layer glass or glass-like materials), prepreg material, polyimide, polyamide, liquid crystal polymer, epoxy-based Build-Up Film, FR4 material, polytetrafluoroethylene (Teflon), a ceramic, and a metal oxide. Although prepreg or FR4 are usually preferred, other materials may be used as well.

In an embodiment, the at least one electrically conductive layer structure comprises at least one of the group consisting of copper, aluminum, and nickel. Although copper is usually preferred, other materials are possible as well.

In an embodiment, the component carrier is a laminate-type component carrier. In such an embodiment, the component carrier is a compound of multiple layer structures which are stacked and connected together by applying a pressing force, if desired accompanied by heat.

In an embodiment, the component carrier comprises at least one hole (such as a through hole or a blind hole) extending partially or completely through the heat spreading module and being at least partially filled with electrically conductive material. Correspondingly, the manufacturing method may comprise forming at least one hole (in particular through hole) in the heat spreading module, and at least partially filling the at least one hole with electrically conductive material. As a result, the heat spreading module may also be used for establishing an electric interconnection by electrically conductive material extending through the heat spreading module.

In an embodiment, the electrically conductive material is electrically coupled with at least two electrically conductive layer structures of the component carrier material above and below the heat spreading module to thereby form an electrically conductive vertical interconnect extending through the heat spreading module. Correspondingly, the manufacturing method may comprise vertically electrically interconnecting two electrically conductive layer structures of the component carrier material by the electrically conductive material filling the at least one through hole extending through the heat spreading module. In such a preferred embodiment, a vertical interconnection of metallic layer structures above and below the heat spreading module may be established by the metal filled through holes extending through the heat spreading module.

In an embodiment, the component carrier comprises electrically conductive material extending (for instance vertically) through the heat spreading module. Preferably, the electrically conductive material is electrically decoupled from the heat spreading module (preferably from the carbon structure) by electrically insulating material. Thus, electric signals or electric supply current can be transmitted along a short path via the electrically conductive material through the heat spreading module. The carbon structure may nevertheless remain hermetically sealed.

The aspects defined above and further aspects of the invention are apparent from the examples of embodiment to be described hereinafter and are explained with reference to these examples of embodiment.

BRIEF DESCRIPTION OF THE DRAWINGS

FIG. 4 and FIG. 5 illustrate different cross-sectional views of constituents of component carriers according exemplary embodiments of the invention, wherein these constituents are a preform of a heat spreading module and a readily manufactured heat spreading module of adjustable shape.

FIG. 6 illustrates a cross-sectional view of a component carrier with embedded electronic component and integrated heat spreading modules according to another exemplary embodiment of the invention.

DETAILED DESCRIPTION OF ILLUSTRATED EMBODIMENTS

Figure 1:
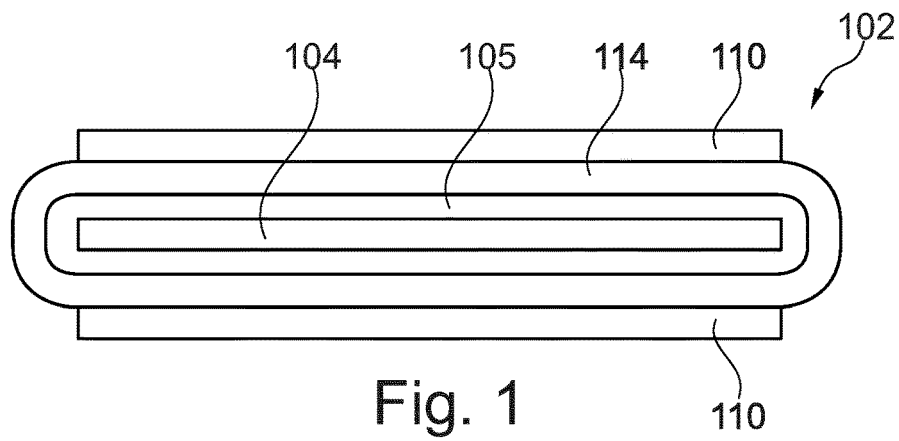
FIG. 1 illustrates a cross-sectional view of a heat spreading module for a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a method of manufacturing a reliable component carrier (such as a printed circuit board, PCB) with (in particular pyrolytic) graphite structure (in particular sheet) as a heat conducting structure is provided.

Pyrolytic graphite sheets can be properly implemented in a component carrier due to its huge thermal conductivity (of more than 1000 W/(mK)). The implementation of such a material in a PCB build up as a heat conductive module can change dramatically the efficiency of heat management in the PCB level. This is in particular of advantage for mobile applications such as smartphones, power books, tablets and action cameras where space is restricted.

Nevertheless, pyrolytic graphite sheets alone have the tendency to delaminate very easily from PCB material. Due to this material characteristic, embedding pyrolytic graphite sheets directly in component carrier material (such as resin comprising material, for example prepreg) simply by attaching it to component carrier material is not possible, when a high reliability is required.

However, according to an exemplary embodiment of the invention, a heat spreading module for implementation into a component carrier is provided, wherein such a heat spreading module is composed of a pyrolytic graphite sheet fully enclosed within a dielectric shell (for instance of liquid crystal polymer material). The dielectric shell prevents the component carrier from undesired electric interaction of the electrically conductive pyrolytic graphite sheet with the PCB electrics and has a sufficient adhesion capability for preventing delamination between heat spreading module and adjacent component carrier material. Thus, a heat spreading module which is based on a pyrolytic graphite sheet is provided that is capable to meet reliability demands (in particular reflow and solder related temperature stresses) of component carriers such as PCBs.

Further challenges that rise with the implementation of a pyrolytic graphite sheet in a PCB body are:

The pyrolytic graphite sheet attached to core material (in many cases FR4) cannot be properly structured (for instance perforated, cut, etc.) directly during the manufacturing of the PCB. The reason for this is related to potential cross-contamination of the production line due to the creation of graphite powder which can be highly electrically conductive.

The pyrolytic graphite sheet is electrically conductive and should be isolated from the rest of the copper network in the finished PCB.

A special build up should be implemented in the component carrier/pyrolytic graphite sheet manufacturing in order to create component carriers being reliable to thermomechanical stresses (i.e. with small CTE mismatch).

In order to integrate a pyrolytic graphite sheet reliably and successfully into a component carrier build up, the challenges mentioned above should be addressed. One first possibility to address the two first mentioned challenges for the implementation of a pyrolytic graphite sheet in a component carrier such as a PCB is to customize a pyrolytic graphite sheet layer according to the thermal requirements of the application and also on its layout.

This can be done via the creation of an extra design which may be based on the original component carrier design. For example, the pyrolytic graphite sheet layer can be made directly by laser or mechanical cutting of the pyrolytic graphite sheet. The pyrolytic graphite sheet design can be made in a way to avoid copper interconnections between the layers of the component carrier. The registration of the pyrolytic graphite sheet layer on the component carrier can be made via one or more fiducials. The material of the pyrolytic graphite sheet may be embedded in a dielectric shell, preferably with an adhesion promoter or primer in between. A so obtained heat spreading module can be attached, as a whole, to component carrier material such as epoxy, copper and adhesives.

The coated pyrolytic graphite sheet can be patterned or structured with a laser or mechanical process in accordance with a desired application. The design should be done in a way to avoid contact of the pyrolytic graphite sheet with the electrical network in the printed circuit board. After the structuring process, the pyrolytic graphite sheet can remain unprotected at the cut edges. To isolate these open edges, the structured material can be covered with a lamination process. Polyamide (for instance as thin as 5 μm) or B-stage materials can be used in this context.

The protected structured pyrolytic graphite sheet material can now be embedded in component carrier material (such as a PCB body). The structured pyrolytic graphite sheet material after lamination can be drilled and cut normally at the predefined interconnection points.

Another possibility to implement a pyrolytic graphite sheet in a component carrier is to use it where heat conduction in special directions is needed. Corresponding heat spreading modules or inlays may be used to substitute heavy and thick copper inlays mainly used for heat dissipation. The heat can be sent from a hot spot into the heat spreading module or inlay with copper vias (such as plated through holes or filled vias) onto a copper structure that may cover the pyrolytic graphite sheet or other carbon structure. In order to reduce the thermal resistance of the whole build up in z-direction, the area of the hot spot can be made relatively large. A rough estimation for a 25 μm thickness insulation material in the heat spreading module or inlay using thermal conductivity of 0.5 W/mK shows thermal insulance values in the order of 0.5 K cm$^2$/W. Nevertheless, the thickness of the inlay's insulation material can be reduced by a factor three depending on special requirements. One variation for this implementation is to use it as an efficient heat transporter throughout the component carrier for applications where copper coins or inlays cannot be used. This way, the pyrolytic graphite sheet can be used in plane or perpendicular to the component carrier main surface, which results in a compact architecture. Therefore, a pyrolytic graphite sheet can also be used in a component carrier for a smart phone. A corresponding build up may also be a rigid-flex build up. In another embodiment, a heat spreading module or pyrolytic graphite sheet inlay may also be used in a flexible PCB (for example installed on a heat sink or on a metallic support (for instance aluminum)).

To address the last mentioned challenge listed above, low CTE prepregs can be advantageously used in order to insert heat spreading modules or inlays on the basis of carbon structures in a PCB with great reliability.

Measurements and simulations on the thermal performance of heat spreading modules on the basis of a pyrolytic graphite sheet have been performed. Such measurements show clearly that the presence of a pyrolytic graphite sheet or foil in the construction may improve its heat spreading performance. As a consequence, the overall temperature of a hot spot in a component carrier may be lowered significantly, for instance by 40% or more. Also simulations have been performed that qualitatively agree with the data measured in the described measurements.

According to an exemplary embodiment of the invention, a pyrolytic graphite sheet or layer in a component carrier such as a PCB may render the heat transport more efficient, since its thermal conductivity can be significantly larger (for instance a factor of about four better) than the one of copper.

In an embodiment, a production method is provided which may avoid cross-contamination in the manufacturing line due to the creation of graphite powder in the equipment.

Moreover, it is possible that the embedding of an electrically conductive pyrolytic graphite sheet in the component carrier is carried out so that it is kept isolated from the electrically conductive (in particular copper) network in the component carrier.

In an embodiment, the provision of a carbon structure such as a pyrolytic graphite sheet provides advantageously a very thin solution for high thermal conductivity.

For instance, the pyrolytic graphite sheet can be embedded in an existing PCB stack as a conventional inlay with less design restrictions.

A printed circuit board with implemented pyrolytic graphite sheet or other carbon structure can manage larger amounts of heat than conventional PCBs. In particular, PCBs with one or more pyrolytic graphite sheets can tackle down hot spots more efficiently than in conventional approaches.

Furthermore, exemplary embodiments reduce the risk of contamination with graphite powder in the production line and in the PCB due to the enclosure of a pyrolytic graphite sheet with a dielectric shell.

Thus, a multifunctional PCB or other components carrier can be provided in terms of electrical and heat management.

Exemplary embodiments of the invention may be implemented for example in automotive applications, lighting applications, mobile devices, or power electronics. Such and others applications demand more and more efficient in-board heat management solutions. Further, there is a need for the implementation of pyrolytic graphite sheet or other carbon structures in mobile devices (such as smartphones, tablets, cameras, power books, etc.).

Heat spreading at the PCB Level has become a very important topic in the electronics industry. Further, the improvement of heat spreading at the PCB level will, for example, increase cooling via convection, improve the heat transport in the interface between PCB and cooling system (such as a heat sink), etc. Pyrolytic graphite sheet material, which can be implemented in a component carrier according to an exemplary embodiment of the invention, can carry large amounts of heat. It may outperform copper by about a factor of four in its thermal conductivity.

Although pyrolytic graphite sheet has an outstanding performance in terms of thermal conductivity, this material is very brittle and unreliable to be used as a sole layer in a component carrier. However, a pyrolytic graphite sheet hermetically and fully circumferentially surrounded by a dielectric shell can be embedded reliably in a PCB or other component carrier and used as a heat spreading layer.

FIG. 1 illustrates a cross-sectional view of a heat spreading module 102 for a component carrier 100 according to an exemplary embodiment of the invention.

The shown heat spreading module 102 comprises a layer-type graphite structure 104 hermetically enclosed within a fully surrounding dielectric shell 106 which hermetically seals the graphite structure 104 around its entire circumference. The graphite structure 104 is here embodied as a planar layer of pyrolytic graphite, being highly thermally and electrically conductive. In the shown embodiment, the entire dielectric shell 106 is homogeneously made of the same non-PCB material. The dielectric shell 106 can be made of a flexible or bendable electrically insulating material such as a liquid crystal polymer or polyimide. The heat spreading module 102 furthermore comprises an optional layer of adhesion promoter 114 promoting adhesion and being arranged as a surface coating between the graphite structure 104 and the dielectric shell 106. The adhesion promoter 114 ensures that the graphite structure 104 and the dielectric shell 106 properly adhere to one another without delamination. In addition, the heat spreading module 102 comprises electrically conductive layer structures 110 in form of copper foils attached to both opposing main exterior surfaces of the dielectric shell 106.

In particular when the optional adhesion promoter 114 is absent, the dielectric shell 106 may also be made of an adhesion promoting material.

It is also possible that the adhesion promoter 114, when present, can be made of an adhesive material (for instance an adhesive material on epoxy basis).

It is furthermore possible that the adhesion promoter 114, when present, can have a thiol group. A thiol may be denoted as an organosulfur compound that contains a carbon-bonded sulfhydryl or sulphydryl (—C—SH or R—SH) group (where R represents an alkyl or other organic substituent). Such a sulfur compound has turned out as being capable of efficiently promoting adhesion. However, other adhesion promoting material may be implemented as well. An adhesion promoter may be used as an additive or as a primer to promote adhesion of the carbon structure and the dielectric shell. Advantageously, the material of the adhesion promoter 114 should have a high affinity with regard to the material of the graphite structure 104 and to the material of the dielectric shell 106. It is also preferred that the material of the adhesion promoter 114 is temperature stable over a broad temperature range.

Figure 3:
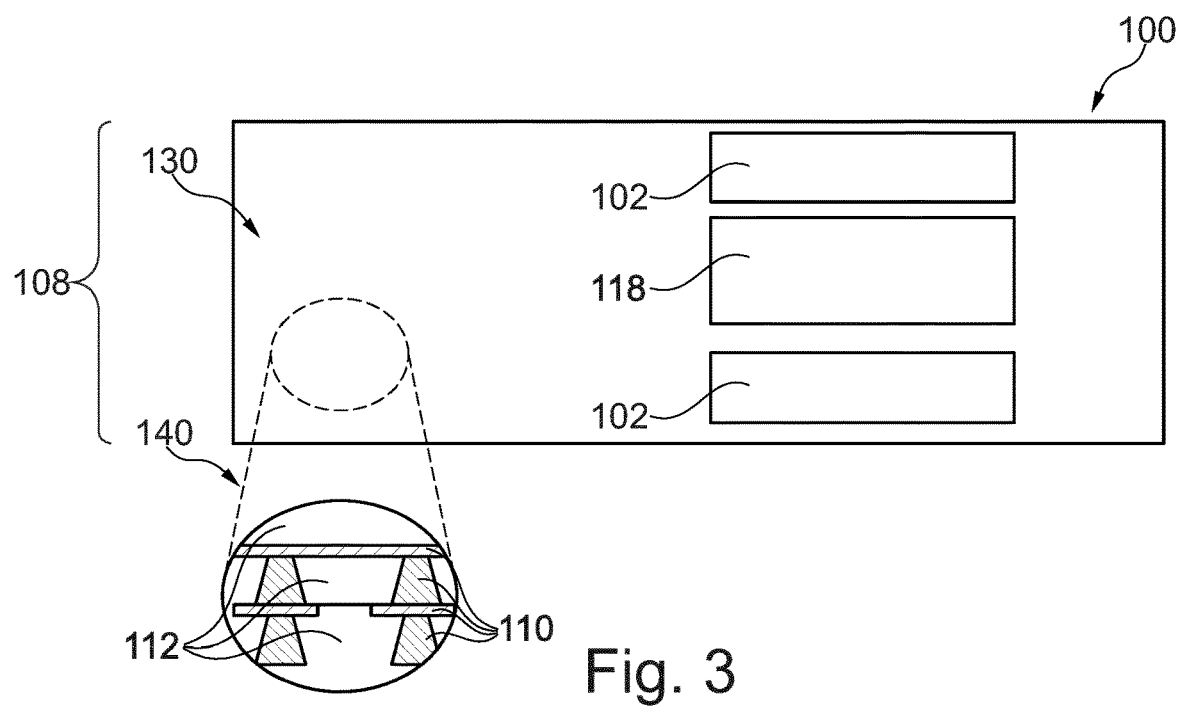
FIG. 3 illustrates a cross-sectional view of a component carrier with embedded electronic component according to another exemplary embodiment of the invention.

The heat spreading module 102 according to FIG. 1 can be taken as such and may be implemented (for instance may be laminated) at any desired position of a component carrier at a selectable location where an outstanding cooling performance is required (see for example FIG. 3).

Figure 2:
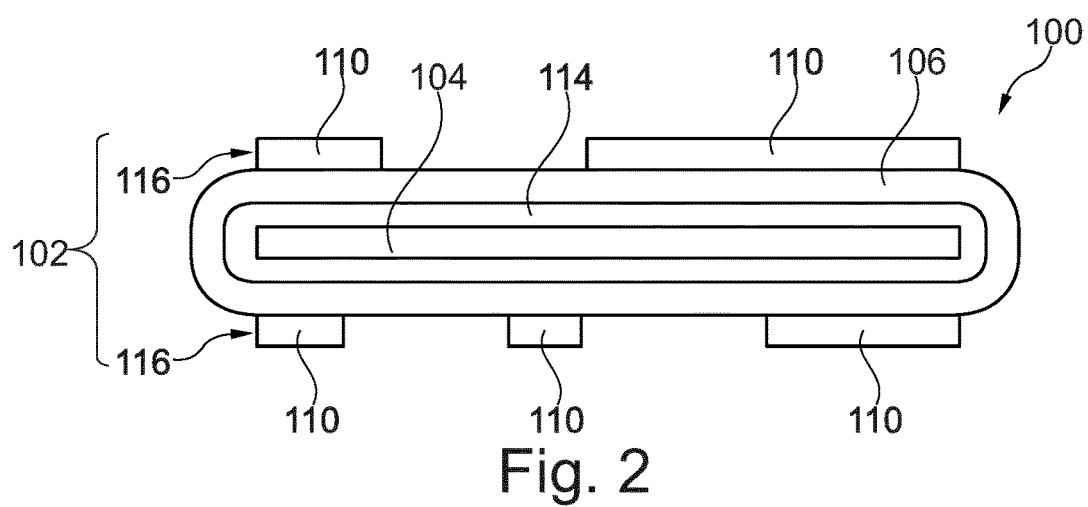
FIG. 2 illustrates a cross-sectional view of a flexible component carrier with a heat spreading module according to an exemplary embodiment of the invention.

FIG. 2 illustrates a cross-sectional view of a flexible component carrier 100 with a heat spreading module 102 according to an exemplary embodiment of the invention. The structure shown in FIG. 2 is extremely simple but can be used, without additional provisions, as a flex board.

As can be taken from a comparison of FIG. 2 with FIG. 1, the flex-board type component carrier 100 can be manufactured based on the heat spreading module 102 according to FIG. 1 by simply patterning the electrically conductive layer structures 110 (here copper foils) to thereby form electric conductor structures 116 (such as electrically conductive traces) on the dielectric shell 106. The electric performance of the component carrier 100 is provided by the electric conductor structures 116, whereas the thermal performance of the component carrier 100 is provided by the graphite structure 104 (which may alternatively be any other kind of carbon structure or any other thin highly thermally conductive material that is electrically conductive as well). The dielectric shell 106 guarantees a high electric reliability by electrically decoupling the highly electrically conductive elements with reference numeral 104 and 116 from one another. At the same time, the dielectric shell 106 together with the sheet like graphite structure 104 render the component carrier 100 bendable. Undesired delamination phenomena which might occur in case of a direct contact between the carbon structure 104 on the one hand and the electric conductive structure 116 on the other hand can be suppressed or prevented thanks to the adhesion promoter 114 and the dielectric shell 106.

Hence, the component carrier 100 shown in FIG. 2 consists only of the graphite structure 104, the dielectric shell 106 hermetically enclosing the graphite structure 104, the patterned electric conductor structure 116 on the dielectric shell 106, and the adhesion promoter 114 arranged between and promoting adhesion between the graphite structure 104 and the dielectric shell 106. An electronic component (see reference numeral 118 in FIG. 3) may be mounted on the electric conductor structure 116.

FIG. 2 shows that a highly compact flex board with outstanding thermal performance can be manufactured according to an exemplary embodiment of the invention.

In an embodiment, the component carrier 100 shown in FIG. 2 can be used as an inlay for a further component carrier (for instance in a corresponding manner as shown in FIG. 6). In other words, the component carrier 100 according to FIG. 2 can form part of a board-in-board device.

FIG. 3 illustrates a cross-sectional view of a component carrier 100 with embedded electronic component 118 according to another exemplary embodiment of the invention. The shown component carrier 100 is a plate type printed circuit board with laminated constituents.

The component carrier 100 shown in FIG. 3 comprises schematically shown component carrier material 130 in form of a stack 108 (compare detail 140) of electrically conductive layer structures 110 (made of copper) and electrically insulating layer structures 112 (made of prepreg or FR 4 material, i.e. glass fibres in a resin matrix). Two heat spreading modules 102, for instance constituted as shown in FIG. 1, are embedded in the stack 108 above and below an embedded electronic component 118 (such as a semiconductor chip), respectively. As can be taken from FIG. 3, the electronic component 118 is located vertically between the two heat spreading modules 102 so that heat generated during operation of the electronic component 118 can be efficiently removed by the heat spreading modules 102, thereby preventing overheating of the electronic component 118.

FIG. 4 and FIG. 5 illustrate different cross-sectional views of constituents of component carriers 100 according exemplary embodiments of the invention, wherein these constituents are a preform of a heat spreading module 102 and a readily manufactured heat spreading module 102.

Referring to FIG. 4, a graphite structure 104 enclosed within a dielectric shell 106 is shown in a cross-sectional view and in a plan view, wherein the shown arrangement indicates positions of recesses 152 to be formed at which no graphite structure 104 should be present in a readily manufactured component carrier 100. Fiducials 154 for aligning (more precisely for registration of the graphite structure 104 on the component carrier 100) are shown as well.

Referring to FIG. 5, the result of a procedure of patterning (for instance by a laser or mechanical or chemical process) the graphite structure 104 for physically forming the recesses 152 in the graphite structure 104 is shown. The graphite structure 104, coated with dielectric material of the dielectric shell 106, can therefore be treated to expose portions of the graphite structure 104, i.e. edges adjacent to regions from which material has been removed. Subsequently, the exposed portions of the graphite structure 104 may be covered with additional dielectric material 132 to thereby close or complete the dielectric shell 106 of the graphite structure 104. This allows to manufacture a heat spreading module 102 with a graphite structure 100 of any desired shape, in particular being present only in one or more island regions and being nevertheless fully encapsulated by dielectric shell 106. FIG. 5 hence shows the previously unprotected and structured graphite structure 104 covered with dielectric material after lamination.

FIG. 6 illustrates a cross-sectional view of a component carrier 100 with two surface-mounted (additionally or alternatively with embedded) electronic component 118 and with integrated heat spreading modules 102 according to an exemplary embodiment of the invention.

The component carrier 100 according to FIG. 6 therefore has two electronic components 118 being hot spots during operation of the component carrier 100, i.e. generating a considerable amount of heat. Two heat spreading modules 102, which can be manufactured as described according to FIG. 4 and FIG. 5, are embedded in stack 108 of electrically conductive layer structures 110 as well as electrically insulating layer structures 112. As indicated with horizontal arrows in FIG. 6, respective heat removal accesses are provided by the heat spreading modules 102 at opposing lateral edges of the stack 108. Electrically conductive vertical interconnect structures 120, which are here embodied as (one or more) copper vias and which form an electrical network 156, electrically connect a portion above with a portion below the heat spreading modules 102. As indicated by additional arrows in FIG. 6, also the copper material of the electrically conductive layer structures 110 and of the vertical interconnect structures 120 contributes to the heat removal.

The electrically insulating layer structures 112 comprises for instance a mixture of resin (in particular epoxy resin) and fibers (in particular glass fibers), in particular prepreg material or FR4 material. Preferably, the electrically insulating layer structures 112 are made of a low shrinkage material, i.e. material which has only a small tendency of shrinking in the presence of pressure or during cooling. In addition, the electrically insulating layer structures 112 should be made of a material having a low thermal expansion coefficient, for instance less than 10 ppm/K. This keeps thermal mismatch small. Furthermore, the electrically insulating layer structures 112 should be made of a material having a low value of the Young modulus (preferably less than 10 GPa at 250° C.). A sufficiently soft dielectric material reduces stress and prevents undesired delamination.

Figure 7:
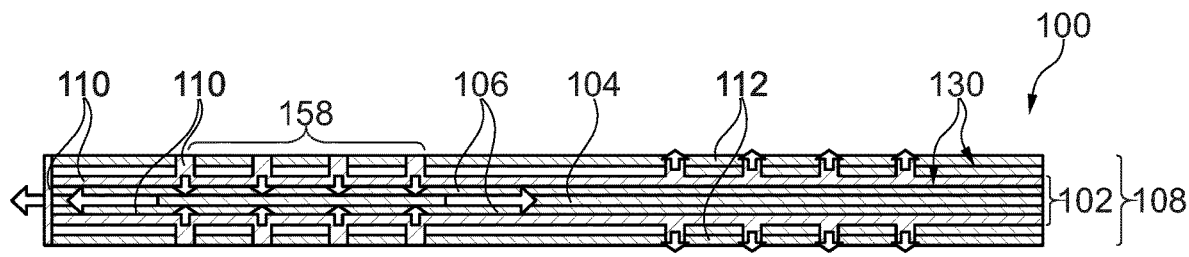
FIG. 7, FIG. 8 and FIG. 9 illustrate cross-sectional views of component carriers with embedded heat spreading modules, also indicating heat flow directions, according to other exemplary embodiments of the invention.
Figure 8:
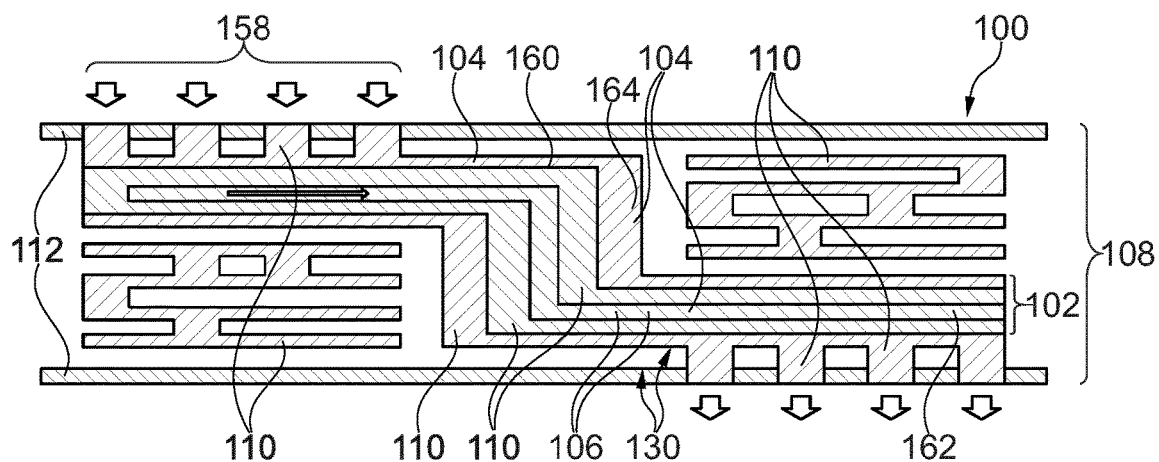
Figure 9:
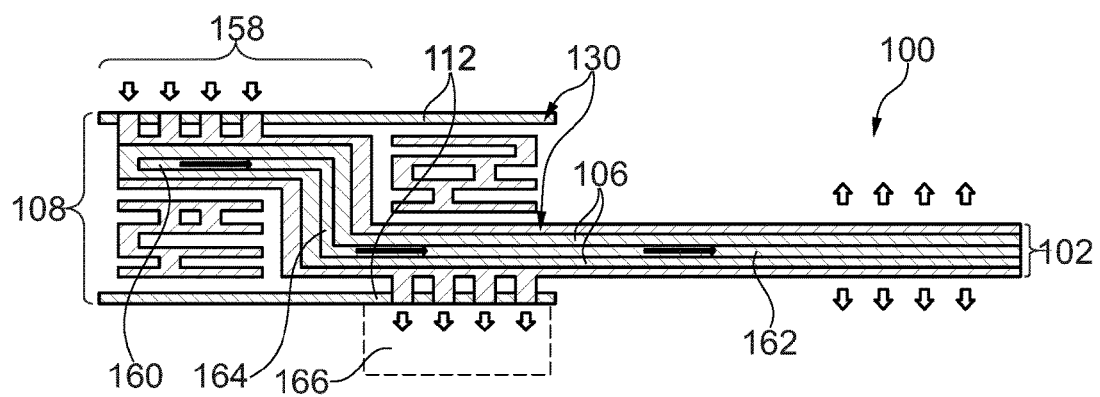

FIG. 7, FIG. 8, and FIG. 9 illustrate cross-sectional views of portions of component carriers 100 with embedded heat spreading modules 102, also indicating heat flow directions by means of arrows, according to other exemplary embodiments of the invention. For the sake of completion, it is valid to emphasize that the copper vias of FIGS. 7,8 and 9 may be through holes as well. A through-hole copper via can be insulated as described in FIG. 6.

Referring to FIG. 7, a component carrier 100 with a direct connection of the embedded heat spreading module 102 (which may also be denoted as an inlay with pyrolytic graphite) with thermal vias 158 (which may be made of copper) is provided. The arrows according to FIG. 7 again show the heat flow.

Referring to FIG. 8, a component carrier 100 with a substantially Z-shaped bent graphite structure 104 of a heat spreading module 102 is shown. The graphite structure 104 comprises two parallel horizontally aligned sections 160, 162 connected via one perpendicular vertically aligned section 164 in between. The embodiment according to FIG. 8 hence shows a heat spreading module 102 which may be used to transport heat perpendicular to a surface of the graphite structure 104. Referring to FIG. 9, a component carrier 100 is provided accomplishing a heat transport with a rigid-flex configuration. According to FIG. 9, it is for instance possible to surface mount a heat source 166 (such as a camera module), as indicated with dotted lines. The heat source 166 here may be also advantageously mounted in the set of vias 158. The reason for this is the heat flow indicated by the arrows.

Figure 10:
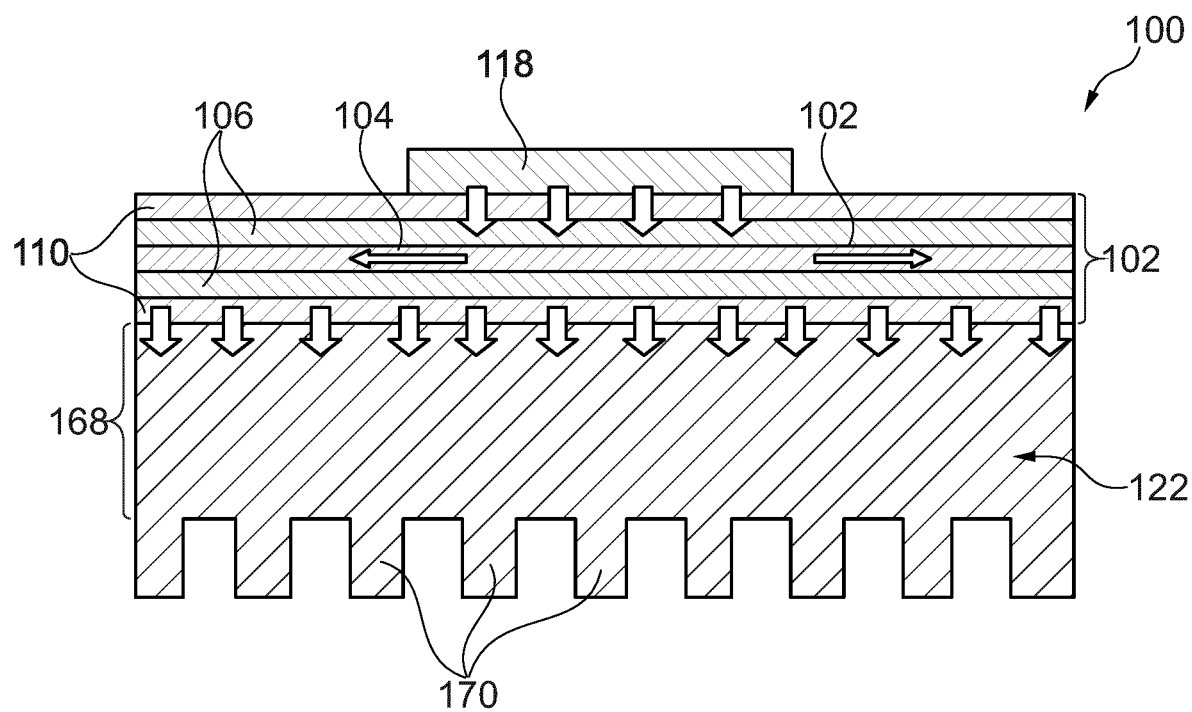
FIG. 10 illustrates a component carrier with embedded heat spreading module and heat sink according to another exemplary embodiment of the invention.

FIG. 10 illustrates a component carrier 100 with embedded heat spreading module 102 and heat sink 122 according to another exemplary embodiment of the invention. The additionally provided heat sink 122, for instance made of aluminum or copper, is thermally coupled with the heat spreading module 102 (which may here be embodied as a flex pyrolytic graphite inlay). The heat sink 122 comprises a solid body 168 of highly thermally conductive material with integrally formed cooling fins 170. Thus, the embodiment according to FIG. 10 shows a heat spreading module 102 as flexible PCB installed on heat sink 122.

Figure 11:
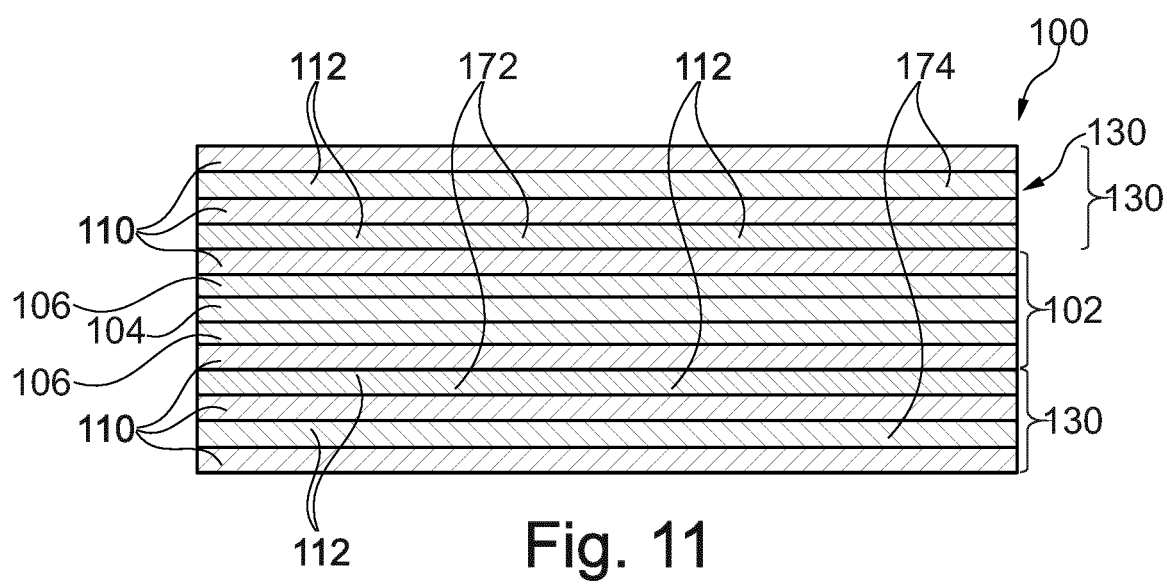
FIG. 11 illustrates a cross-sectional view of a component carrier with an integrated heat spreading module according to another exemplary embodiment of the invention.

FIG. 11 illustrates a cross-sectional view of a component carrier 100 with an integrated heat spreading module 102 according to another exemplary embodiment of the invention. According to FIG. 11, a heat spreading module 102 (as described above) has been pressed between two cores with copper. More specifically, both an upper main surface and a lower main surface of the heat spreading module 102 is pressed together with a respective prepreg layer 172 (which may be a low CTE prepreg) and with a respective core 174 (such as FR4), each of which being separated from one another by a respective electrically conductive layer structure 110 (in particular copper foils). An optional advantageous primer or adhesion promoting layer between the graphite structure 104 and the dielectric shell 106 is not shown in FIG. 11.

Figure 12:
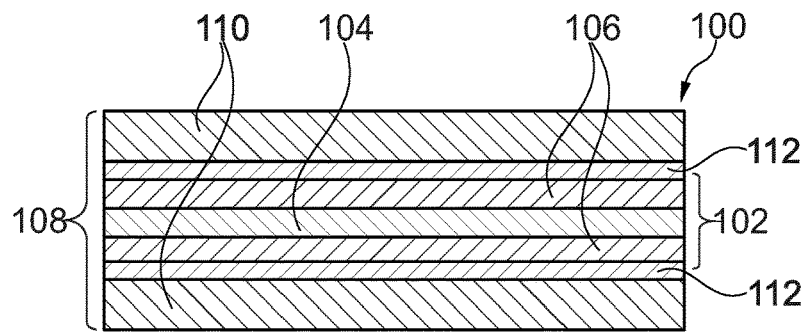
FIG. 12 illustrates a cross-sectional view of a fabricated component carrier with an integrated heat spreading module according to another exemplary embodiment of the invention.

FIG. 12 illustrates a cross-sectional view of a fabricated component carrier 100 with an integrated heat spreading module 102 according to another exemplary embodiment of the invention. The heat spreading module 102 according to FIG. 12 has been tested with a diode having a power of 2 W as heat source.

Figure 13:
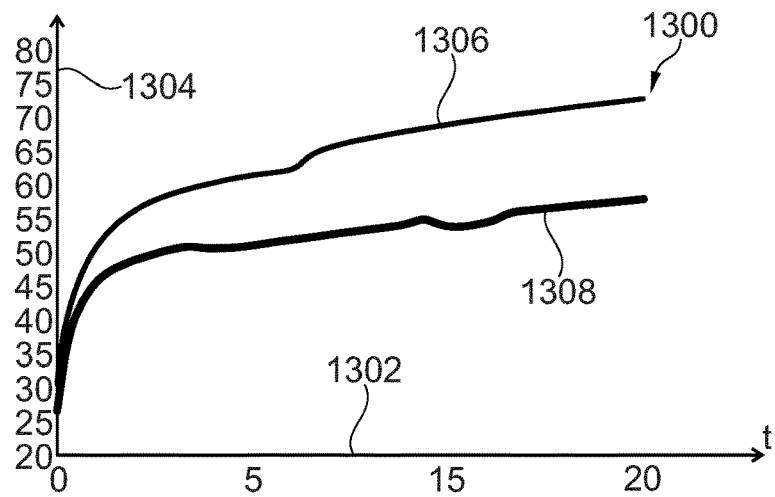
FIG. 13 and FIG. 14 are diagrams illustrating a cooling performance of a component carrier with heat spreading module according to an exemplary embodiment of the invention.
Figure 14:
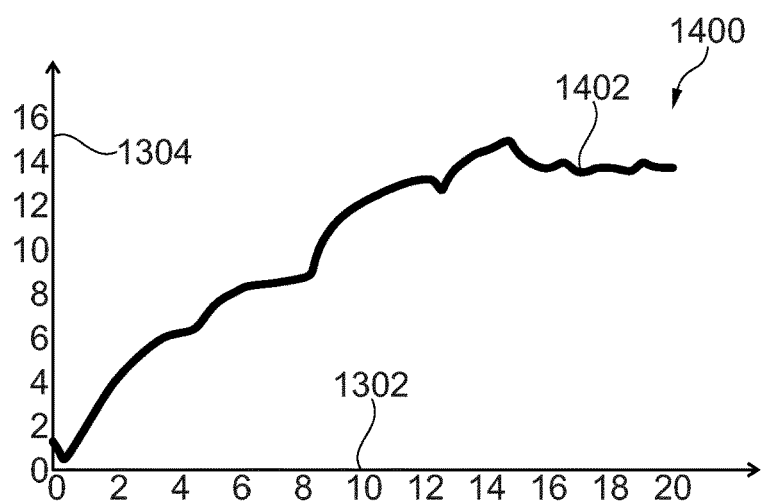

FIG. 13 and FIG. 14 are diagrams 1300, 1400 illustrating a cooling performance of component carrier 100 with the heat spreading module 102 of FIG. 12 according to an exemplary embodiment of the invention.

Referring to FIG. 13, diagram 1300 has an abscissa 1302 along which the time is plotted in minutes. Along an ordinate 1304, the temperature is plotted in degrees Celsius. Hence, FIG. 13 shows the temperature of the heat source as a function of the time. A first curve 1306 relates to copper material. A second curve 1308 relates to the graphite structure 104 of the heat spreading module 102.

Referring to FIG. 14, a diagram 1400 is shown plotting, as curve 1402, the difference of the temperature between copper dummy and demonstrator with pyrolytic graphite. Hence, FIG. 13 and FIG. 14 show measurements in which the pyrolytic graphite sheet inlay or heat spreading module 102 is integrated in a simple build up as described in FIG. 12. The same structure has been measured with and without the pyrolytic graphite sheet inlay in its build up. FIG. 13 shows the temperature of the hot spot positioned in the center of the sample for both cases (copper refers to the sample without the pyrolytic graphite sheet inlay where the heat transport relies only on the copper foils). It is clear that the pyrolytic graphite sheet layer improves the temperature transport in the plane of the structure facilitating cooling via convection. This explains the lower temperatures measured. FIG. 14 shows the temperature difference between both samples as function of time. At steady state, the temperature difference stabilizes at 14K. It is believed that the temperature performance of the pyrolytic graphite sheet inlay can be even more improved when connecting it to the hot spot with effective copper filled vias.

Figure 15:
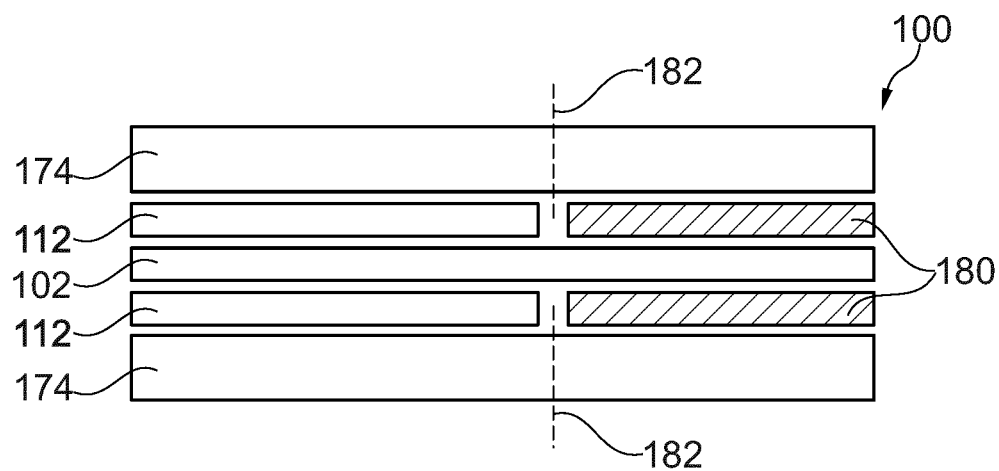
FIG. 15, FIG. 16 and FIG. 17 illustrate cross-sectional views of component carriers with embedded heat spreading modules according to other exemplary embodiments of the invention.
Figure 16:
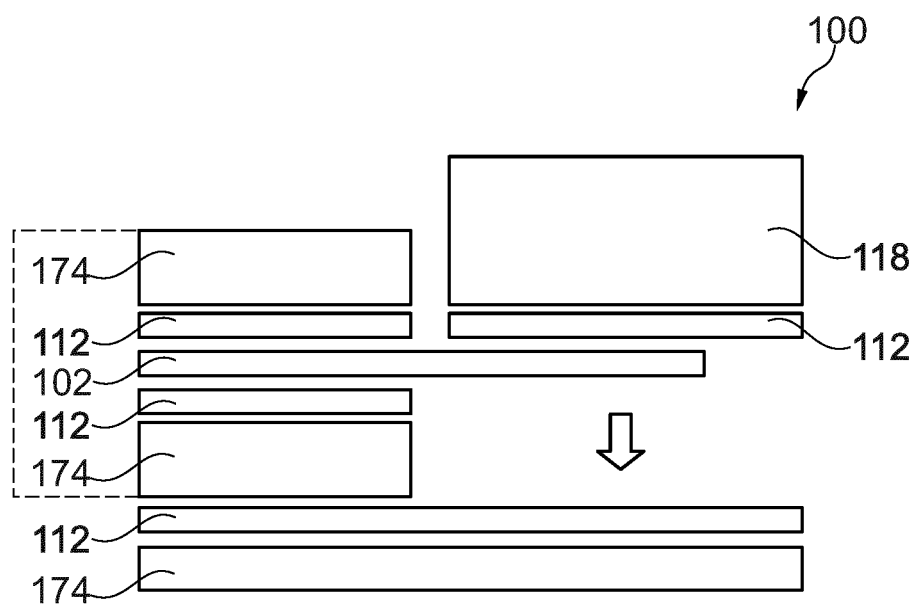
Figure 17:
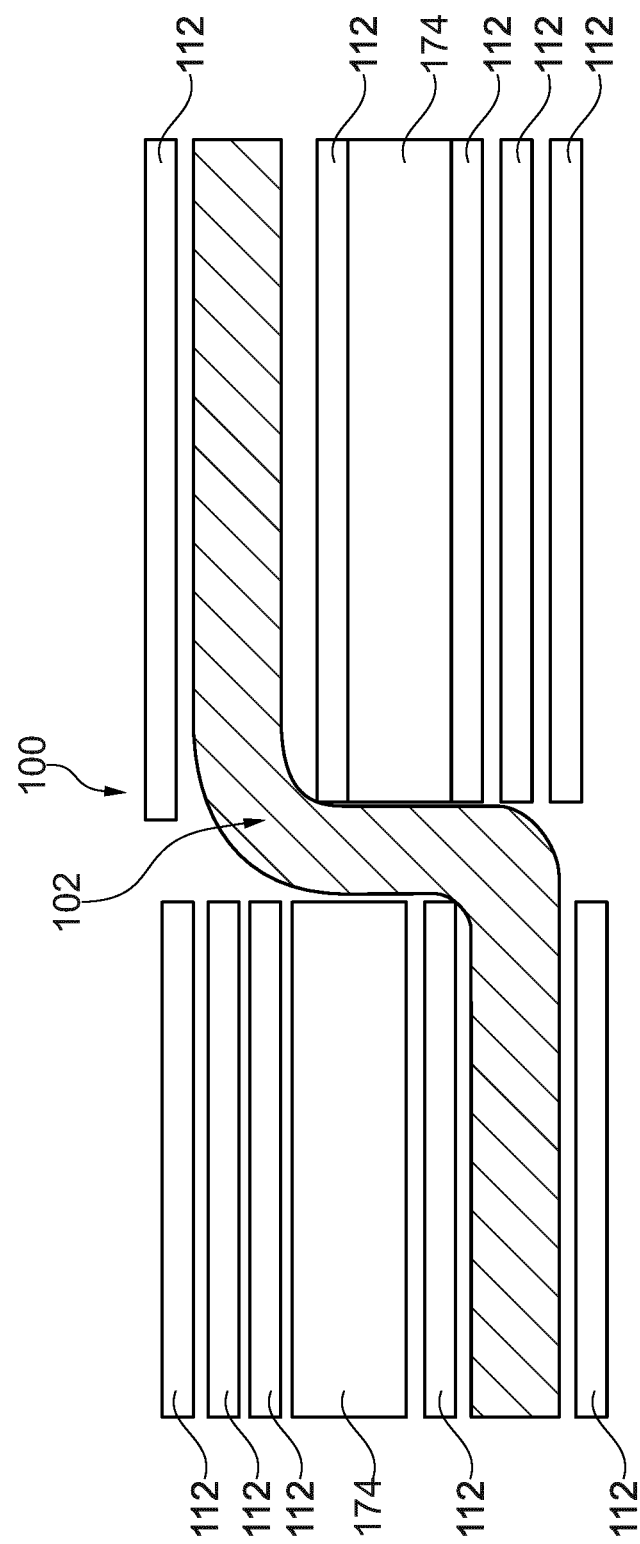

FIG. 15 to FIG. 17 illustrate cross-sectional views of component carriers 100 with embedded heat spreading modules 102 according to other exemplary embodiments of the invention.

Referring to FIG. 15, an arrangement is shown in which two opposing main surfaces of a heat spreading module 102 (which may be constituted as described above) are covered symmetrically. The main surfaces of the heat spreading module 102 are each covered in a first section with an electrically insulating layer structure 112 (such as prepreg) and in a second section with a release layer 180. The respective electrically insulating layer structure 112 and juxtaposed release layer 180 are then covered with a respective core 174 (such as fully cured resin, FR4, etc.). Upon cutting along cutting lines 182, it is possible to remove portions of the core 174 above and below the release layer 180. In view of the property of the release layers 180 to lack adhesion with adjacent material, it is possible to simply remove portions of the cores 174 after cutting along cutting lines 182. A result is shown in FIG. 16.

Referring to FIG. 16, the structure obtained after the cutting described referring to FIG. 15 can then be laminated together with a further core 174, a further electrically insulating layer structure 112 (which may be made from prepreg) and an electronic component 118 (such as a PCB inlay in a board-in-board implementation).

Referring to FIG. 17, it is shown how a bent structure of a heat spreading module 102 may be obtained, for instance with an architecture according to FIG. 15 and FIG. 16.

Figure 18:
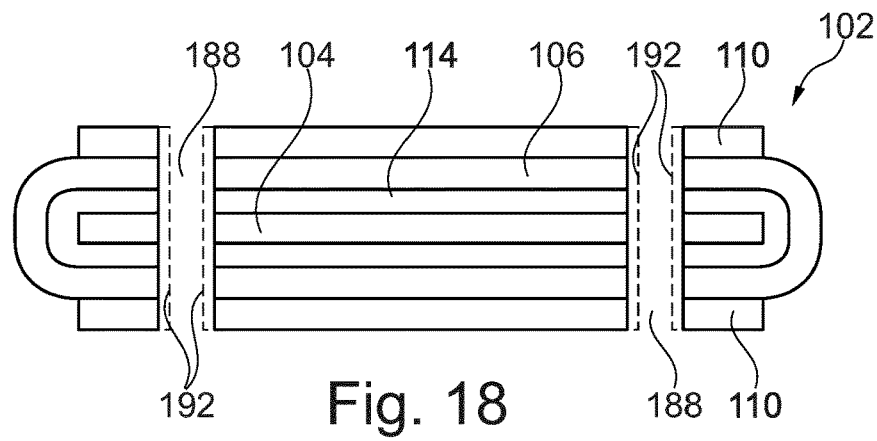
FIG. 18, FIG. 19 and FIG. 20 illustrate cross-sectional views of preforms of a component carrier with embedded heat spreading module obtained during carrying out a method of manufacturing a component carrier according to an exemplary embodiment of the invention.
Figure 19:
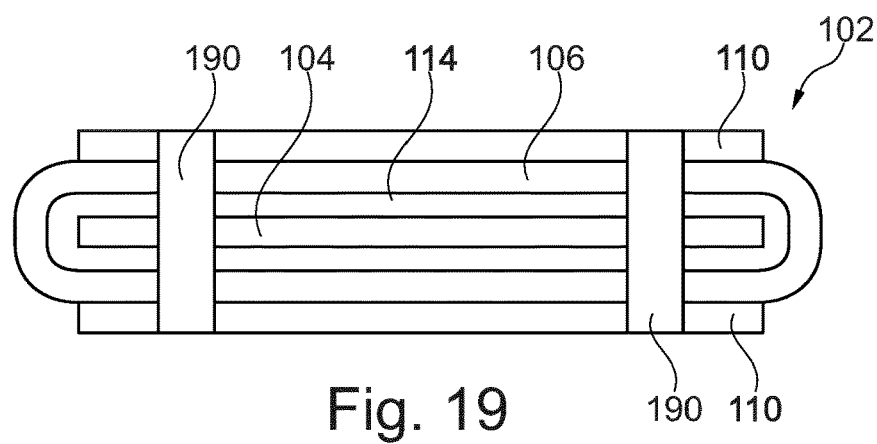
Figure 20:
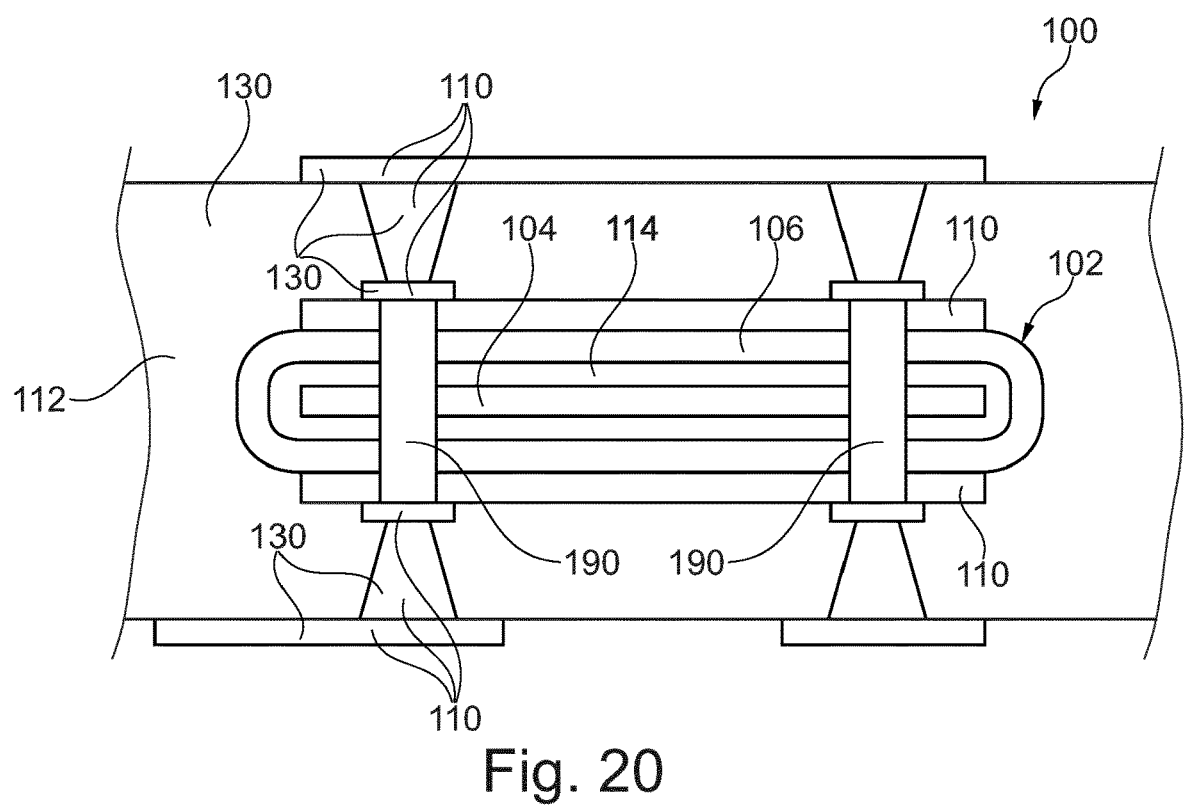

FIG. 18 to FIG. 20 illustrate cross-sectional views of preforms of a component carrier 100 with embedded heat spreading module 102 obtained during carrying out a method of manufacturing a component carrier 100 according to an exemplary embodiment of the invention.

Referring to FIG. 18, one or more through holes 188 are formed in a heat spreading module 102 as shown in FIG. 1. The through holes 188 may for instance be formed by mechanically drilling, by laser drilling, by milling, etc. As an alternative to the formation of through holes 188, it may also be possible to form one or more blind holes in the heat spreading module 102, for instance for improving heat dissipation properties of a manufactured component carrier 100. As a further alternative, it is also possible to form the blind or through hole(s) 188 by embedding a release layer (not shown, for instance made of a waxy or Teflon based material) in the heat spreading module 102 which has the property of poorly adhering to surrounding material. Thereafter, a circumferential hole may be formed in the heat spreading module 102 extending up to the release layer. In view of the poor adhesion of the material the release layer to surrounding material, it is then possible to take out a piece of the heat spreading module 102 above the release layer and circumferentially limited by the circumferential hole, to thereby complete formation of the hole 188.

After having formed the one or more holes 188, it may be advantageous to smooth the walls of the one or more holes 188 before further processing. For instance, such a smoothing can be carried out with a laser treatment, which may for instance remove exposed portions of graphite material within the respective hole 188. By taking this measure, mechanical stress during operation of the readily manufactured component carrier 100 may be reduced, any tendency of delamination can be suppressed, and electric short-circuits can be prevented. Additionally or alternatively to such a smoothing procedure, it is optionally also possible to coat or cover exposed side walls of the one or more holes 188 by a sidewall coating 192 (which may be made of an electrically insulating material or an electrically conductive material).

Referring to FIG. 19, the through holes 188 are filled with electrically conductive material 190 such as copper. This can for instance be accomplished by plating, by electroless deposition, by galvanization, etc.

Referring to FIG. 20, the modified heat spreading module 102 as shown in FIG. 19 is embedded in component carrier material 130 to thereby obtain a component carrier 100 according to an exemplary embodiment of the invention. In particular, the heat spreading module 102 with the through holes 188 filled with the electrically conductive material 190 may be embedded (in particular by laminating) in one or more electrically insulating layer structures 112 and/or one or more electrically conductive layer structures 110. By taking this measure, an electrically conductive connection extending vertically through the heat spreading module 102 may be established. This may keep electric paths short, may result in a compact component carrier 100 and allows keeping ohmic losses low. In the shown embodiment, electrically conductive layer structures 110 on both opposing main surfaces of the component carrier 100 may be electrically interconnected by the electrically conductive material 190 extending through the heat spreading module 102.

Thus, an interconnection between electrically conductive traces above and below a heat spreading module 102 may be accomplished by drilling at least one through hole 188 in the heat spreading module 102 and at least partially filling the through hole 188 by the electrically conductive material 190 (in particular copper).

Figure 21:
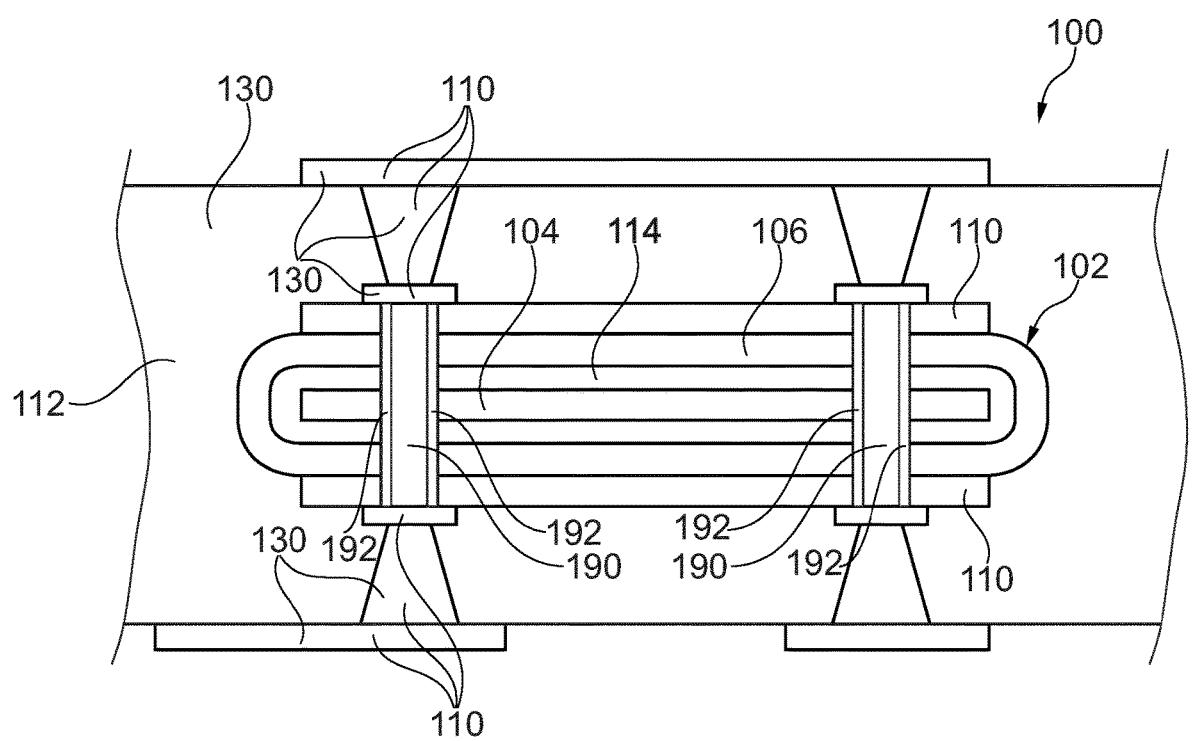
FIG. 21 illustrates a cross-sectional view of a component carrier with embedded heat spreading module being traversed by an electrically conductive structure according to another exemplary embodiment of the invention.

FIG. 21 illustrates a cross-sectional view of a component carrier 100 with embedded heat spreading module 102 being traversed by an electrically conductive structure, in form of electrically conductive material 190, according to another exemplary embodiment of the invention. As can be taken from FIG. 21, electrically insulating sidewall coating 192 electrically and mechanically decouples the electrically conductive material 190 with regard to the heat spreading module 102, in particular with regard to the graphite structure 104. As a consequence, in particular when the electrically insulating sidewall coating 192 is made of the same material as the dielectric shell 106 or the adhesion promoter 114, the graphite structure 104 remains hermetically sealed. Advantageously, the electrically conductive material 190 forms a metallic connection (laterally electrically insulated by the electrically insulating sidewall coating 192) extending through the heat spreading module 102. For instance, this electrically conductive material 190 may be used for the transmission of electric signals or currents through the heat spreading module 102.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A component carrier, comprising:
   component carrier material; and
   a heat spreading module which comprises a dielectric shell and a carbon structure enclosed within the dielectric shell for disabling contact between the carbon structure and the component carrier material,
   wherein the dielectric shell is an outer covering of the carbon structure fully circumferentially encasing the carbon structure,
   wherein the heat spreading module is configured to dissipate heat in a horizontal direction along a direction of main extension of the component carrier.

2. The component carrier according to claim 1, wherein the carbon structure is a carbon sheet.

3. The component carrier according to claim 1, wherein the carbon structure comprises pyrolytic graphite.

4. The component carrier according to claim 1, wherein the component carrier material comprises a stack of at least one electrically conductive layer structure and/or at least one electrically insulating layer structure, wherein the heat spreading module is mounted on and/or is embedded in the stack.

5. The component carrier according to claim 4, comprising at least one of the following features:
   wherein the at least one electrically insulating layer structure is made of a low shrinkage material;
   wherein the at least one electrically insulating layer structure is made of a material having a low thermal expansion coefficient,
   wherein the material of the electrically insulating layer structure has a value of the thermal expansion coefficient in a range between 1 ppm/K and 10 ppm/K;
   wherein the at least one electrically insulating layer structure is made of a material having a low value of the Young modulus of less than 15 GPa at 250° C.;
   wherein the component carrier comprises at least two heat spreading modules embedded in the stack with a respective heat removal access at a lateral edge of the stack, wherein at least one electrically conductive vertical interconnect structure electrically connects a portion above with a portion below the heat spreading modules.

6. The component carrier according to claim 1, wherein the dielectric shell hermetically seals the carbon structure.

7. The component carrier according to claim 1, wherein the entire dielectric shell is homogeneously made of the same material.

8. The component carrier according to claim 1, wherein the dielectric shell comprises at least one of the group consisting of a flexible material, a thermoplastic material, polyimide, and a liquid crystal polymer.

9. The component carrier according to claim 1, further comprising an adhesion promoter promoting adhesion and arranged between the carbon structure and the dielectric shell.

10. The component carrier according to claim 9, wherein at least one of the dielectric shell and the adhesion promoter comprises an adhesive material.

11. The component carrier according to claim 1, wherein the dielectric shell is made of an adhesion promoting material.

12. The component carrier according to claim 1, comprising at least one of the following features:
wherein the heat spreading module comprises at least one electric conductor structure on and/or above the dielectric shell;
wherein the component carrier further comprises an electronic component mounted on and/or embedded in the component carrier material, wherein the electronic component is located neighboured to the heat spreading module so that heat generated during operation of the electronic component is at least partially removed by the heat spreading module,
wherein the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element and a logic chip.

13. The component carrier according to claim 1, comprising at least one of the following features:
wherein the carbon structure, in particular the graphite structure, comprises at least one of the group consisting of a planar layer, and a continuous structure with at least one horizontal layer section and a vertical section;
wherein the component carrier further comprises a heat sink thermally coupled with the heat spreading module;
wherein the at least one electrically conductive layer structure comprises at least one of the group consisting of copper, aluminum, and nickel;
wherein the at least one electrically insulating layer structure comprises at least one of the group consisting of resin, Epoxy resin, Bismaleimide-Triazine resin, cyanate ester, glass, glass fibers, prepreg material, polyimide, polyamide, polytetrafluoroethylene, liquid crystal polymer, epoxy-based Build-Up Film, FR4 material, FR5 material, a ceramic, and a metal oxide;
wherein the component carrier is shaped as a plate;
wherein the component carrier is configured as one of the group consisting of a printed circuit board, and an IC substrate;
wherein the component carrier is configured as a laminate-type component carrier;
wherein the component carrier comprises electrically conductive material extending through the heat spreading module being electrically decoupled from the heat spreading module, more particularly from the carbon structure by electrically insulating material.

14. A component carrier, comprising:
a carbon structure;
a dielectric shell hermetically enclosing the carbon structure,
wherein the dielectric shell is an outer covering of the carbon structure fully circumferentially encasing the carbon structure; and
a patterned electric conductor structure on the dielectric shell;
wherein the carbon structure is configured to dissipate heat in a horizontal direction along a direction of main extension of the component carrier.

15. The component carrier according to claim 14, further comprising an adhesion promoter arranged between and promoting adhesion between the carbon structure and the dielectric shell.

16. The component carrier according to claim 14, wherein the component carrier is flexible and/or bendable.

17. The component carrier according to claim 14, wherein the component carrier is an inlay embedded in a larger component carrier.

18. A component carrier, comprising:
a component carrier material;
a heat spreading module which comprises a dielectric shell and a carbon structure enclosed within the dielectric shell for disabling contact between the carbon structure and the component carrier material; and
an adhesion promoter promoting adhesion and arranged between the carbon structure and the dielectric shell.

19. The component carrier according to claim 18, wherein at least on of the dielectric shell and the adhesion promoter comprises an adhesive material.

20. A component carrier, comprising:
a carbon structure;
a dielectric shell hermetically enclosing the carbon structure;
a patterned electric conductor structure on the dielectric shell; and
an adhesion promoter arranged between and promoting adhesion between the carbon structure and the dielectric shell.

21. A method, comprising:
providing a heat spreading module which comprises a carbon structure enclosed by a dielectric shell,
wherein the dielectric shell is an outer covering of the carbon structure fully circumferentially encasing the carbon structure; and
integrating the heat spreading module in component carrier material of a component carrier;
wherein the heat spreading module is configured to dissipate heat in a horizontal direction along a direction of main extension of the component carrier.

22. The method according to claim 21, wherein the method comprises at least one of the following features:
interconnecting a stack of at least one electrically conductive layer structure and/or at least one electrically insulating layer structure with the heat spreading module;
patterning the carbon structure being coated with dielectric material to thereby expose a portion of the carbon structure;
subsequently covering the exposed portion of the carbon structure with additional dielectric material to thereby complete the dielectric shell of the carbon structure;
forming at least one through hole in the heat spreading module;
at least partially filling the at least one hole with electrically conductive material, such that two electrically conductive layer structures of the component carrier material by the electrically conductive material filling the at least one through hole extending through the heat spreading module.

23. The method according to claim 21, further comprising:
integrating the heat spreading module with a printed circuit board for removing heat of an electronic component of the printed circuit board.

* * * * *